(12) United States Patent
Carroll et al.

(10) Patent No.: US 9,530,873 B1
(45) Date of Patent: Dec. 27, 2016

(54) SEMICONDUCTOR ADIABATIC QUBITS

(71) Applicant: Sandia Corporation, Albuquerque, NM (US)

(72) Inventors: Malcolm S. Carroll, Albuquerque, NM (US); Wayne Witzel, Albuquerque, NM (US); Noah Tobias Jacobson, Albuquerque, NM (US); Anand Ganti, Albuquerque, NM (US); Andrew J. Landahl, Albuquerque, NM (US); Michael Lilly, Albuquerque, NM (US); Khoi Thi Nguyen, Albuquerque, NM (US); Nathaniel Bishop, Albuquerque, NM (US); Stephen M. Carr, Albuquerque, NM (US); Ezra Bussmann, Albuquerque, NM (US); Erik Nielsen, Albuquerque, NM (US); James Ewers Levy, Albuquerque, NM (US); Robin J. Blume-Kohout, Albuquerque, NM (US); Rajib Rahman, West Lafayette, IN (US)

(73) Assignee: Sandia Corporation, Albuquerque, NM (US)

(*) Notice: Subject to any disclaimer, the term of this patent is extended or adjusted under 35 U.S.C. 154(b) by 291 days.

(21) Appl. No.: 14/054,659

(22) Filed: Oct. 15, 2013

Related U.S. Application Data

(60) Provisional application No. 61/757,609, filed on Jan. 28, 2013.

(51) Int. Cl.
G06N 99/00 (2010.01)
H01L 29/66 (2006.01)

(52) U.S. Cl.
CPC ....... *H01L 29/66977* (2013.01); *G06N 99/002* (2013.01)

(58) Field of Classification Search
None
See application file for complete search history.

(56) References Cited

U.S. PATENT DOCUMENTS

2005/0224784 A1* 10/2005 Amin et al. ............ 257/14
2007/0180586 A1* 8/2007 Amin ................ 977/755
(Continued)

OTHER PUBLICATIONS

Storcz, M.J. "Decoherence, control, and encoding of coupled solid-state quantum bits." PhD diss., Ludwig-Maximilians-Universitat, Munchen. (Aug. 2005). 273 pages.*

(Continued)

*Primary Examiner* — Stanley K Hill
*Assistant Examiner* — Benjamin Buss
(74) *Attorney, Agent, or Firm* — Medley, Behrens & Lewis, LLC

(57) ABSTRACT

A quantum computing device that includes a plurality of semiconductor adiabatic qubits is described herein. The qubits are programmed with local biases and coupling terms between qubits that represent a problem of interest. The qubits are initialized by way of a tuneable parameter, a local tunnel coupling within each qubit, such that the qubits remain in a ground energy state, and that initial state is represented by the qubits being in a superposition of |0> and |1> states. The parameter is altered over time adiabatically or such that relaxation mechanisms maintain a large fraction of ground state occupation through decreasing the tunnel coupling barrier within each qubit with the appropriate schedule. The final state when tunnel coupling is effectively zero represents the solution state to the problem represented in the |0> and |1> basis, which can be accurately read at each qubit location.

20 Claims, 16 Drawing Sheets

(56) References Cited

U.S. PATENT DOCUMENTS

2010/0241780 A1* 9/2010 Friesen ............... G06N 99/002 710/305
2011/0054876 A1* 3/2011 Biamonte et al. ............... 703/15
2011/0121895 A1* 5/2011 Morello et al. ............... 327/581

OTHER PUBLICATIONS

Rohling, N. et al. "Universal quantum computing with spin and valley states." New Journal of Physics 14.8 (Aug. 2012): 083008. 19 pages. doi:10.1088/1367-2630/14/8/083008.*
Fuhrer, A. et al. "Few electron double quantum dots in InAs/InP nanowire heterostructures." Nano letters 7.2 (2007): 243-246. Web Publication: Dec. 24, 2006. DOI: 10.1021/nl061913f.*
Gupta, N. "Numerical studies of transport and spin-orbit exchange in InAs nanowires." Thesis, University of Waterloo. (2013). 74 pages.*
Burkard, G. "Theory of solid state quantum information processing." arXiv preprint cond-mat/0409626 (2004). 57 pages.*
Taylor, J.M. "Hyperfine interactions and quantum information processing in quantum dots." PhD diss., Harvard University Cambridge, Massachusetts. (2006). 309 pages.*
Ramsay, A.J. "A review of the coherent optical control of the exciton and spin states of semiconductor quantum dots." Semiconductor Science and Technology 25.10 (2010): 103001. 23 pages. DOI:10.1088/0268-1242/25/10/103001.*
Wilhelm, F.K. et al. "Superconducting Qubits II: Decoherence." Manipulating Quantum Coherence in Solid State Systems. NATO Science Series II: Mathematics, Physics and Chemistry vol. 244, 2007, pp. 195-232.*
Żgak, R.A, et al. (2009). "Quantum computing with electron spins in quantum dots." 61 pages. arXiv preprint arXiv:0906.4045.*
van Weperen, et al., "Charge-State Conditional Operation of a Spin Qubit", Physical Review Letters, Jul. 15, 2011, pp. 1-4.
van der Wiel, et al., "Electron Transport Through Double Quantum Dots", Review of Modern Physics, vol. 75, Jan. 2003, pp. 1-22.
Taylor, et al., "Fault-tolerant Architecture for Quantum Computation Using Electrically Controlled Semiconductor Spins", Nature Physics, vol. 1, Dec. 2005, pp. 177-183.
Santoro, et al., "Theory of QUantum Annealing of an Ising Spin Glass", Science, vol. 29, Mar. 2002, pp. 2427-2430.
Fuechsle, et al., "Spectroscopy of Few-Electron Single-Crystal Silicon Quantum Dots", Nature Technology, 2010, pp. 1-4.
Johnson, et al., "Quantum Annealing with Manufactured Spins", Nature, vol. 473, May 12, 2011, pp. 194-198.
Farhi, et al., "Quantum Computation by Adiabatic Evolution", MIT CTP # 2936, Jan. 28, 2000, pp. 1-24.

* cited by examiner

Tunable FET coupler design

SEMICONDUCTOR ADIABATIC QUBITS

RELATED APPLICATION

This application claims priority to U.S. Provisional Patent Application No. 61/757,609, filed on Jan. 28, 2013, and entitled "SEMICONDUCTOR QUBITS FOR ADIABATIC QUANTUM ANNEALING AND QUANTUM COMPUTING", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

An exemplary quantum computing apparatus includes qubits, which are analogous to bits employed in conventional transistor-based computing devices. While bits are binary in nature, a qubit can have a state associated therewith that is representative of a 1, a 0, or a superposition of a 1 and 0. Multi-qubit systems are further distinguished from classical systems through forming quantum entangled systems. Entanglement and tunneling are resources identified as possible sources for computational acceleration that can lead to exceeding the capabilities of conventional transistor-based computing devices.

Adiabatic quantum annealing has been proposed as a technology for employment in a quantum computing apparatus. Generally, adiabatic quantum annealing refers to representing an optimization problem in terms of an energy landscape for which the global minimum represents the optimized solution. Starting from a known ground state, constructed using an external field that can be modulated to zero, the system is slowly evolved to the ground state of the optimization problem as the external field is turned off. In conventional implementations of adiabatic quantum annealing in quantum computing apparatuses, qubits have been pursued in superconductors, wherein a flux associated with a qubit is indicative of its state (e.g., 1, 0, or a superposition of both). Superconductor-based qubits have been applied to a specific optimization problem, referred to as a quadratic unconstrained binary optimization (QUBO) problem. More particularly, a quantum computing apparatus that comprises 100 superconductor qubits has been developed, and has been shown to accurately solve particular QUBO problems. Scaling properties in this relatively small number of qubits appears promising relative to conventional computer solve times for random samplings of QUBO problems (e.g. not necessarily hard problems).

Various deficiencies corresponding superconductor qubits have been identified, however, including but not limited to 1) a restricted tunability for the adiabatic evolution (e.g., the alteration of energy states); 2) programming precision; 3) energy gap size relative to noise (e.g., at least in the 100 qubits regime); 4) relatively fast noise dynamics near anticrossings sufficient to produce errors; 5) lack of a clear approach to suppress or correct errors; 6) qubit uniformity and yield; and 7) lack of tests that prove enhanced speed of the quantum computing apparatus relative to other quantum computing apparatuses (e.g., measures of adiabaticity, quantum behavior, and entanglement).

Other exemplary approaches that have been discussed pertaining to adiabatic quantum computing include the history state approach, holonomic gates, and quantum simulation. Additionally, effort has been set forth in atomic physics-based quantum computing to utilize ions and neutrons in connection with performing computation. Currently, however, no known correction for loss of neutrons or ions exists for the adiabatic quantum computing approach, rendering it difficult to implement such an adiabatic quantum computing algorithm without significant error.

SUMMARY

The following is a brief summary of subject matter that is described in greater detail herein. This summary is not intended to be limiting as to the scope of the claims.

Described herein are various technologies pertaining to an adiabatic quantum computing apparatus. In an exemplary embodiment, a quantum computing apparatus can comprise a plurality of semiconductor adiabatic qubits (semiconductor qubits), wherein such qubits have various properties that are advantageous in comparison to properties of superconductor qubits. In an exemplary embodiment, qubits in the plurality of semiconductor qubits may be charge qubits, wherein a value of a semiconductor qubit is a function of a position of an electron relative to two wells in the semiconductor material. In another exemplary embodiment, a value of the semiconductor qubit may be a function of a direction of spin of an electron. Further, the semiconductor qubits can be double quantum dots (DQD).

The adiabatic semiconductor qubit may be implemented in any suitable semiconductor material, including but not limited to silicon, gallium arsenide, etc. It is to be understood that a small number of such qubits can be utilized to solve certain problems that are intractable for classical computers. The exemplary semiconductor adiabatic qubits described herein are advantageous, in that they can provide protection against environmental noise via an energy gap between states, wherein such energy gap is larger than an energy gap associated with superconductor qubits. Further, in the case of charge qubits or in the case of the spin qubit, the noise (e.g., perturbation on the Hamiltonian) can be significantly smaller than other qubit choices, although the dynamic range of energies might also be less. In non-adiabatic quantum computing apparatuses (e.g., "circuit model"), such an energy gap is not employed for error suppression in the computation.

Furthermore, an exemplary semiconductor qubit can be mediated with respect to its neighbor by way of a controlled Coloumbic interaction. With more particularity, the semiconductor qubits described herein are definable with an eigenbasis of $|1\rangle$ and $|0\rangle$. Additionally, the semiconductor qubit is formed to allow the semiconductor qubit to be biased to a particular state, such that the semiconductor qubit can be caused to have a value of $|1\rangle$ in contrast to a $|0\rangle$, or a value of $|0\rangle$ in contrast to a $|1\rangle$.

Additionally, the plurality of semiconductor qubits can be formed such that a fixed coupling exists between neighboring semiconductor qubits. In another exemplary embodiment, the plurality of semiconductor qubits can be formed such that a programmable and tunable coupling exists between neighboring semiconductor qubits. The individual qubit bias and the qubit-qubit coupling parameters can be used to define a Hamiltonian that represents a problem for which a solution is sought.

Still further, an exemplary semiconductor qubit can be formed such that it has a parameter associated therewith that can produce a quantum-mechanical superposition of the |0> and |1> states, wherein such parameter is programmable in time. The magnitude of such parameter can be tunable to have values from much larger than all other terms in the Hamiltonian (such that a known ground state can always be obtained) to much smaller than all other terms in the Hamiltonian. Values of this parameter can be changed, in time, at a slow enough rate to cause the semiconductor qubits to remain in the ground energy state. Still further, since the semiconductor qubits described herein are associated with relatively large energy gaps (e.g., an energy gap between the ground state and an adjacent energy state), excitation caused by noise can be insufficient to cause a semiconductor qubit to leave the ground state, thereby preventing errors from overwhelming the computation.

Other exemplary aspects pertaining to the qubits described herein include use of a charge qubit for universal adiabatic quantum computing through implementation of a ZX and XX coupling. Furthermore, relaxation processing can be used in semiconductor qubits to produce self-error correction during the quantum annealing process. In another exemplary embodiment, phonon band-gap structures built around the charge qubit can be used to suppress noise and enhance the performance of the adiabatic qubit. In yet another exemplary embodiment, hydrogen lithography can be combined with, for example, STM-patterning to achieve atomic precision fabrication of qubits, thereby achieving the ultimate limit in uniformity and yield of qubits for quantum annealing. In still yet another exemplary embodiment, a charge qubit can be used for improved quantum annealing schedules through the decoupled time-dependent nature of the parameters h, j, and gamma in a charge qubit. Moreover, cryogenic CMOS multiplexers, demultiplexers, and memory capacitors can be integrated on the same chip and used as the silicon qubit chip for control and readout. In another exemplary embodiment, a singlet/triplet (m=−1) double quantum dot (DQD) qubit can be used for quantum annealing, and a singlet/triplet (m=0) DQD qubit can be used for quantum annealing.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
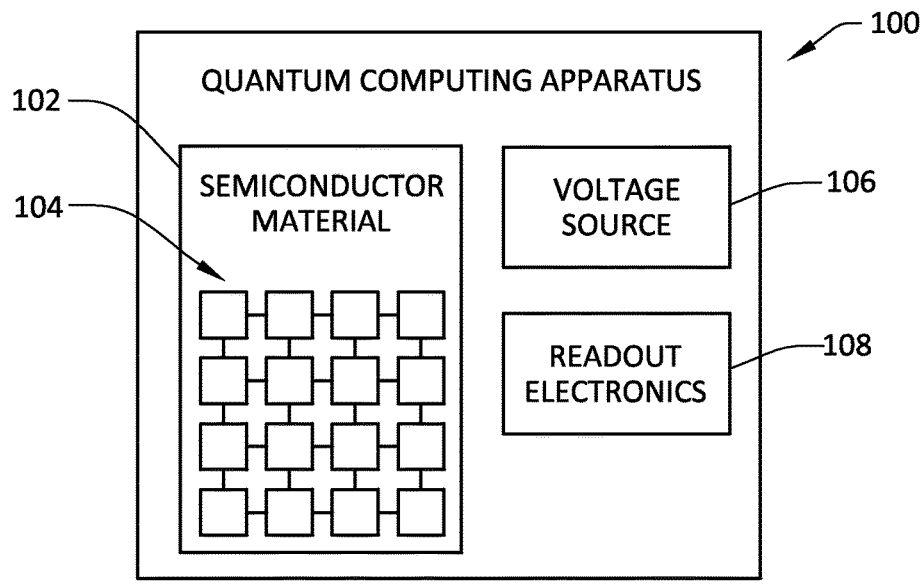
FIG. 1 is a functional block diagram of an exemplary quantum computing apparatus.

Various technologies pertaining to a quantum computing apparatus are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Moreover, as used herein, the term "exemplary" is intended to mean serving as an illustration or example of something, and is not intended to indicate a preference.

Technologies pertaining to quantum computing are described herein. With more particularity, a qubit formed in a semiconductor material is described herein (semiconductor qubit), wherein the qubit is configured for utilization in an adiabatic quantum computing apparatus. Further, as will be described herein, the qubit can be initialized to reside in the ground energy state, and a tunnel coupling parameter can be relatively slowly changed to cause the qubit to remain in the ground state. Subsequently, a value of the semiconductor qubit can be read, wherein a solution to an optimization problem is based upon the value. With more particularity, the semiconductor qubit can be initialized to have a state that corresponds to a superposition of $|0\rangle$ and $|1\rangle$, and the tunnel coupling parameter (in the case of a charge qubit) can be tuned to facilitate tunneling between energy states. Over time, the tunnel coupling parameter can be altered, such that tunneling is (slowly) inhibited. This causes the semiconductor qubit to remain in the ground state, while gravitating towards a readable state. Once tunnel coupling is entirely prohibited, a value of the semiconductor qubit can be read, wherein the solution to the optimization problem is based upon such value.

With reference to FIG. 1, an exemplary quantum computing apparatus 100 is illustrated. In an exemplary embodiment, the quantum computing apparatus 100 can be operated in a refrigerator. As will be described in greater detail herein, the quantum computing apparatus 100 includes a semiconductor material 102, which can be any suitable semiconductor material, including but not limited to silicon (Si), gallium arsenide (GaAs), etc. A grid (a plurality) of semiconductor adiabatic qubits 104 (semiconductor qubits) is formed in the semiconductor material 102. As will be described in greater detail herein, the semiconductor qubits 104 can be initialized based upon a Hamiltonian that represents an optimization problem for which a solution is desired. An adiabatic process can thereafter be undertaken with respect to the semiconductor qubits 104, causing the semiconductor qubits 104 to have states associated therewith that are collectively indicative of the solution to the optimization problem. As will be described in greater detail herein, the semiconductor qubits 104 may be charge qubits, wherein such charge qubits can be double quantum dot (DQD) qubits. Thus, when the qubits 104 are DQDs, the $|0\rangle$ and $|1\rangle$ states can be defined as left or right occupation of the DQD. As will be understood by one skilled in the art, the DQD is a lateral electrostatically gated structure that can have a total of one electron or many electrons for which a single electron instability (left or right occupation) is exploited. In another example, the semiconductor qubits 104 can represent values as a function of spin direction of electrons.

The quantum computing apparatus 100 may also include or be associated with at least one voltage source 106 that can output a voltage that is directed to at least one qubit in the plurality of semiconductor qubits 104. The voltage output by the voltage source 106 can be configured to set a value for a tunable parameter of the semiconductor qubit. For example, each qubit in the plurality of semiconductor qubits 104 can have a parameter associated therewith, wherein a state of a respective qubit can be biased as a function of a value of the parameter. That is, the voltage source 106 can output a signal that causes at least one qubit in the semiconductor qubits 104 to be biased towards a value of that can be tuned and/or programmed, such that the at least one qubit is biased towards a $|1\rangle$ in contrast to a $|0\rangle$.

In another example, a first qubit in the semiconductor qubits 104 can be (Coulombically) coupled to a second qubit in the semiconductor qubits 104, wherein a degree of such coupling is tunable. Thus, the voltage source 106 can output a voltage signal that is directed towards at least one qubit in the semiconductor qubits 104, wherein the voltage signal controls a degree of (Coulombic) coupling between the at least one qubit and a neighboring qubit in the plurality of semiconductor qubits 104. In another exemplary embodiment, such coupling can be fixed (rather than tunable). Still further, the plurality of semiconductor qubits 104 can have a parameter associated therewith that can be controlled to cause the plurality of semiconductor qubits 104 to have a quantum mechanical superposition of $|0\rangle$ and $|1\rangle$ states. Values of such parameters can be tunable in time, wherein the values can be based upon a voltage signal output by the voltage source 106. In other words, the voltage source 106 can output a voltage signal that causes at least one qubit in the plurality of semiconductor qubits 104 to have a state that corresponds to the superposition of $|0\rangle$ and $|1\rangle$ states. In another example, the voltage source 106 can output a voltage signal that causes the plurality of semiconductor qubits 104 to simultaneously have states corresponding to the superposition of $|0\rangle$ and $|1\rangle$ states (e.g., a single voltage signal can simultaneously tune the magnitude of such parameter for all of the semiconductor qubits 104). The magnitude of this parameter can be tuned from being much larger than other terms in a problem Hamiltonian to being much smaller than other terms in the problem Hamiltonian.

The quantum computing apparatus 100 further includes readout electronics 108 that can be configured to ascertain values of qubits in the plurality of semiconductor qubits 104. In an exemplary embodiment, the readout electronics 108 include a scanning electron microscope (SEM), which can generate a SEM image. The read-out is done using a small constriction near the DQD, a quantum point contact (QPC). The conductance is sensitive to the position of the electron in the DQD, which indicates the state of the qubit. Values can be manually identified by way of inspecting the qubits 104 with the SEM. Other techniques for reading values of the qubits 104 are described below.

Operation of the quantum computing apparatus 100 is now set forth. As indicated above, the quantum computing apparatus 100 can be configured to utilize an adiabatic quantum annealing technique in connection with solving an optimization problem. The optimization problem can be represented by a Hamiltonian; an exemplary Hamiltonian that can be constructed for a particular type of quantum annealing optimization is as follows:

$$H_{problem}H_{init}=-\Sigma_i h_i \sigma_{iz} + \Sigma_{i,j>i} K_{ij} \sigma_{jz} - \Gamma(t) \Sigma_i \sigma_{ix} \quad (1)$$

For the charge qubit, $\sigma_x$ and $\sigma_z$ are Pauli operators for pseudo spin bases of the $|L\rangle$ and $|R\rangle$ states. The parameters h and $\Gamma$ can be controlled by the voltage source 106 (e.g., by changing voltages associated therewith).

The voltage source 106 is configured to output voltage signals corresponding to desired parameter values for Eq. (1). Thus, the voltage source 106 can output voltage signals that bias particular qubits to particular states, can optionally output voltage signals that define a degree of coupling between any neighboring qubits, and can further output voltage signals that cause certain qubits to have states associated with the superposition of the $|0\rangle$ and $|1\rangle$ states. Thus, the voltage source 106 is configured to emit voltage signals that initialize the plurality of semiconductor qubits 104 for the optimization problem that is desirably solved. Subsequently, the voltage source 106 can output voltage signals that reduce the coupling between qubits in the plurality of qubits 104. As the coupling is reduced, the qubits settle to states that can be read by the readout electronics 108, wherein the final states of the qubits 104 is indicative of the solution to the optimization problem.

In another exemplary embodiment, the coupling between qubits in the plurality of semiconductor qubits 104 can be fixed (not tunable). In such an embodiment, the plurality of semiconductor qubits 104 can be initially placed in a non-ground state by way of application of an external energy. Such energy can be slowly reduced until the ground state is reached, and values of the qubits 104 can subsequently be read by the readout electronics 108.

Figure 2:
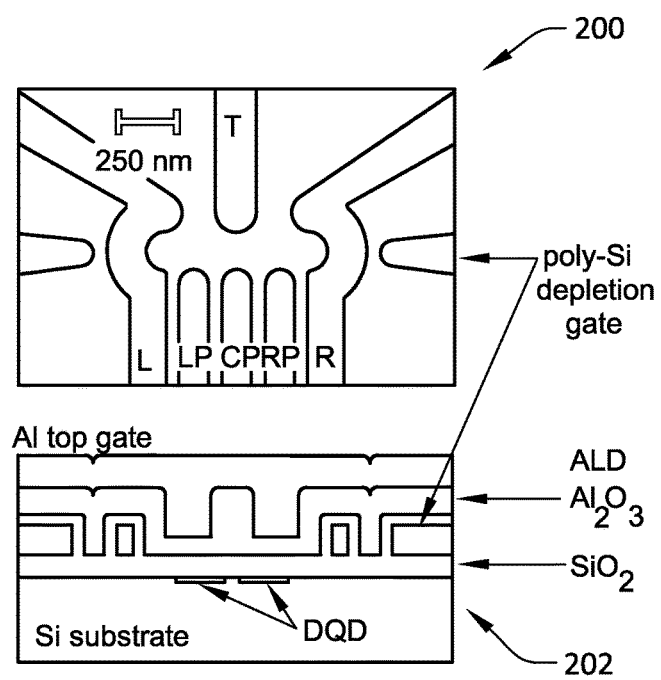
FIG. 2 illustrates exemplary views of a double quantum dot.

With reference to FIG. 2, an exemplary layout 200 of electrodes used to form a DQD is shown. The electrodes include: an L electrode, an LP electrode, a CP electrode, an RP electrode, an R electrode, and a T electrode. The exemplary DQD is also shown as including two electrodes (on the far left and far right) that form the QPCs for charge sensing. Voltage on electrodes LP and RP can control detuning and the magnitude of $\Gamma$. Voltage on the electrode CP (relative to T) can control the magnitude of $\Gamma$. Thus, Voltage on CP relative to T can be used to enhance or decrease tunnel coupling of the DQD with respect to a neighboring qubit, and can thus be varied in time. Voltage on electrode L and/or R affect both the tunnel coupling parameter, gamma, and h. Voltage on LP and RP may also be modified to compensate for overall chemical potential shift of the two dots induced by changing voltage of CP. Cross-capacitances can be characterized such that an accurate calculation can be accomplished. FIG. 2 further includes a cross-sectional view 202 of the DQD. In the cross-sectional view 202, it is indicated that the DQD can include an aluminum electrode (top gate) layered on a relatively thin insulating material ($SiO_2$). In operation, the aluminum electrode can be positively charged, thus attracting electrons in the Si substrate to the insulating material. The DQD is thereby formed on the upper portion of Si.

In an exemplary embodiment, the magnitude of the detuning can be selected as being between approximately −10,000 ueV and approximately 10,000 ueV (e.g., wherein "approximately" is intended to refer to a range within 10% of the specified value). A limit of detuning can be set by a quantum dot energy scale called Coulomb blockade, which is the change in chemical potential sufficient to change the total electron occupation on a dot. The Coulomb blockade energy for small dots can be approximately 10 meV. In an exemplary application, as the proposed two qubit coupling energies will be much smaller, the detuning range can be limited to between approximately −240 ueV to 240 ueV. Larger ranges are possible for both parameters.

An energy range for an exemplary charge qubit can correspond to temperatures of approximately 3K. At least the plurality of qubits 104 of the quantum computing apparatus 100 can, therefore, individually be operated in a refrigerator that can obtain as low a temperature as possible, while supporting electronics input/output, including thermal load of the electronics staged at the cold stage. Additional detail pertaining to layout and electronic staging is set forth below. Further, additional detail about relevant temperature and noise processes is also discussed below. It can be noted that alternative approaches to a cold finger design of dilution refrigerators is also possible, and may assist in maintaining low electron temperatures. For example, immersion of a quantum processor chip in an He3/He4 mixture can produce improved thermal contact to both the substrate and metal connections.

Figure 3:
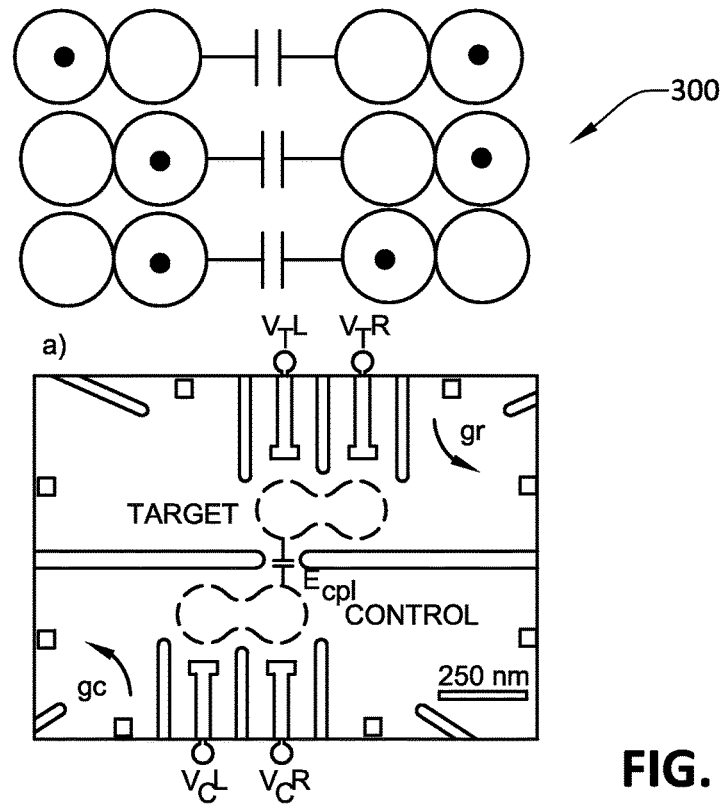
FIG. 3 illustrates exemplary views of neighboring qubits in the quantum computing apparatus that are coupled through a fixed Coulomb repulsion coupling.

Referring now to FIG. 3, coupling of a first DQD to a neighboring DQD is illustrated. A first view 300 shown in FIG. 3 depicts a schematic coupling between two neighboring qubits as a function of Coulomb repulsion. For instance, a charge qubit is an effective electric dipole, and the state of one neighbor qubit affects the relative energies of the left or right state of its neighbors. The dot represents the electron position. The three cases shown represent three different energy configurations, the top most being the lowest energy (i.e., lowest repulsion). Such interaction can be mediated through direct proximity or, alternatively, a coupling capacitance. A second view 302 in FIG. 3 also illustrates capacitive coupling between DQDs, wherein such coupling is fixed.

Figure 4:
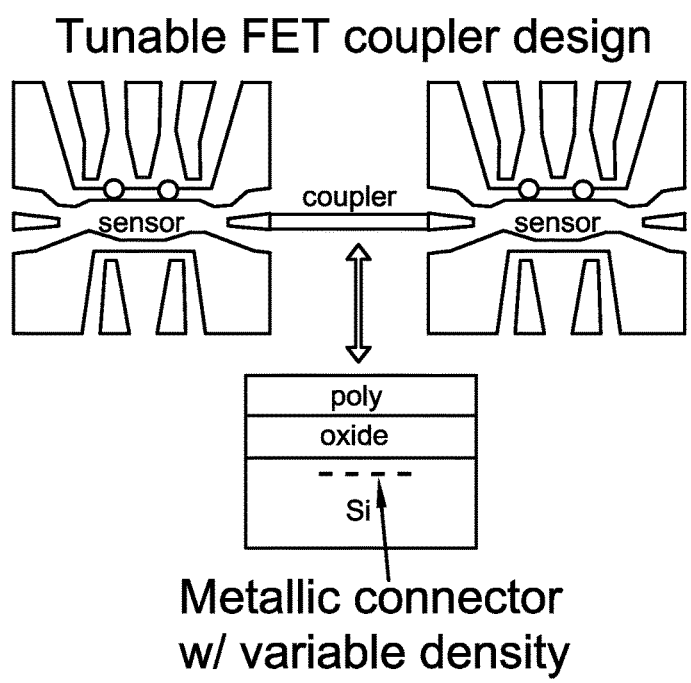
FIG. 4 illustrates an exemplary tunable coupler that can be included in the quantum computing apparatus.

FIG. 4 depicts an exemplary approach where coupling between neighboring DQDs can be made tunable. Specifically, an electrode (gate) can be provided with a signal that causes the electron density in an unconnected channel between the two qubits to alter from being a metallic bar to insulting and therefore removing the coupling. Coupling energies similar to the fixed case can be achieved. Such energies correspond to temperatures of approximately 3 Kelvin. Achievable energies are a function of the limits in fabrication. Proximity of the quantum dots to one another and the charge qubits proximity to coupling electrodes determines the range of energies available in the Hamiltonian. Scanning tunneling microscope (STM) assisted fabrication techniques can be utilized to locate capacitor couplers with atomic precision, thereby allowing for much higher coupling energies to be achieved.

Each qubit state is measured at the end of the algorithm in the Z eigenbasis (i.e., $|left\rangle$ or $|right\rangle$ for charge qubit) through looking at the conductance of a neighboring charge sensor (i.e., QPC or SET) single electron transistor or tunnel barrier. Such conductance is sensitive to the local electrostatic environment and can sense a single electron change in occupation. Accordingly, the measurement technique described herein measures $|L\rangle$ or $|R\rangle$, the Z basis. Since the problem evolution remains in the ground state (due to the tunnel coupling being decreased instead of energy), a final state is stable and can be measured in principle for an arbitrary time, which is expected to lead to high measurement fidelity. The arbitrary measurement time is a positive feature of using the ground state in the adiabatic quantum optimization approach compared to non-adiabatic qubit approaches.

It can be noted that an alternative measurement technique can be to measure current directly through a charge qubit. In order to establish |L> or |R> occupation, a high-frequency pulse can be applied to a gate that would shift the double quantum dot into a resonant condition (that passes current) only for the |L> (or |R>) occupation.

Figure 5:
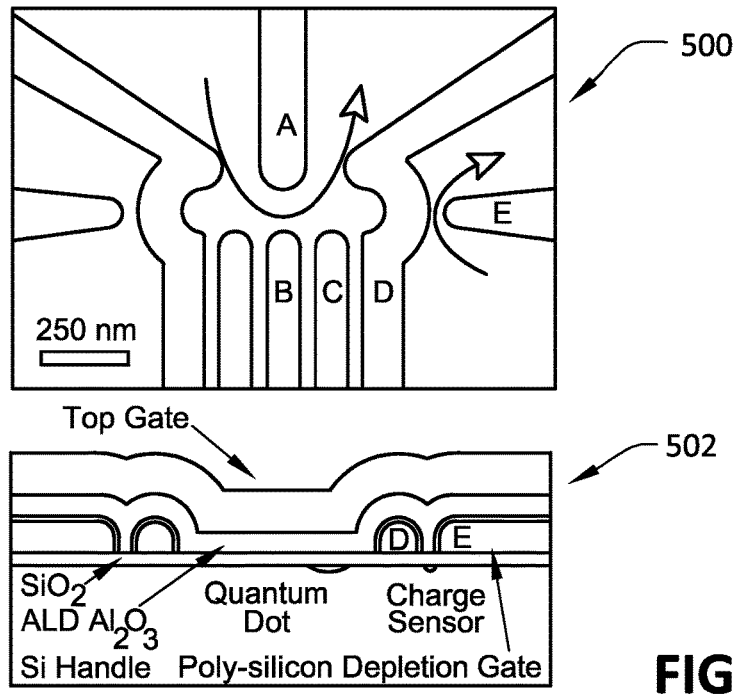
FIG. 5 illustrates an exemplary lay-out and operating technique for reading the electron occupation (i.e., a |left> or |right> state) from a quantum dot.

FIG. 5 depicts an exemplary measurement technique for a silicon metal oxide semiconductor (MOS) quantum dot. With more particularity, FIG. 5 depicts a scanning electron microscope image 500 of a first level of electrodes, as well as a cross-section of the layers of the nanostructure 502. Current through the charge center (gate E) introduces an electron, and a charge sensor can be positioned to detect such electron as shown in FIG. 5.

Figure 6:
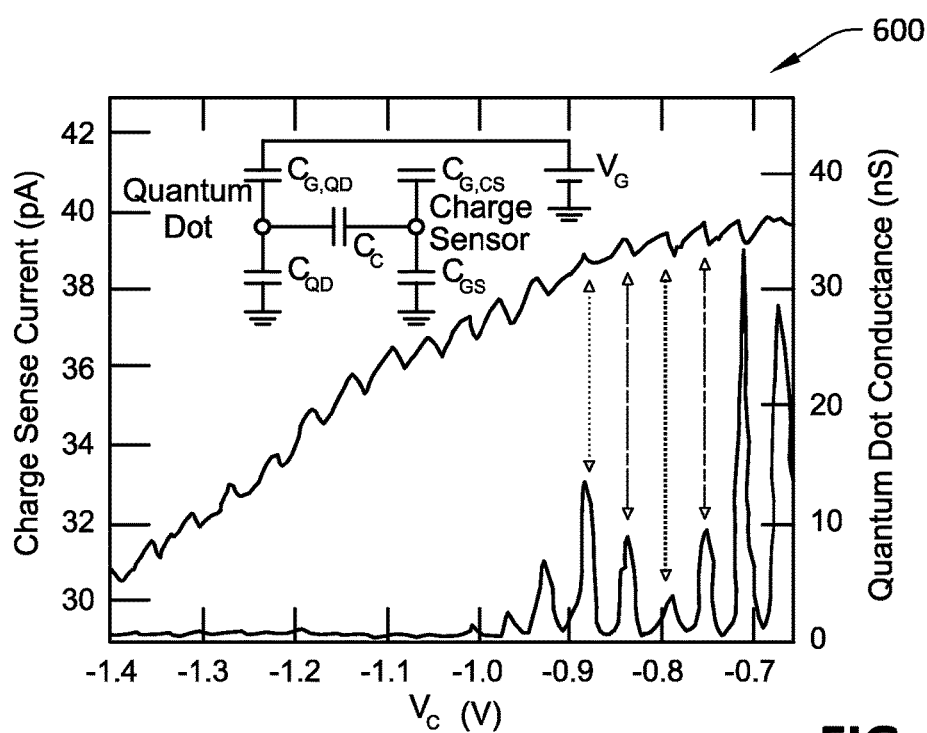
FIG. 6 includes a graph that illustrates current through a quantum dot and through a neighboring charge sensor for FIG. 5, wherein such current can be used to determine a value represented by the quantum dot.

FIG. 6 includes a graph 600 that depicts current through a quantum dot and through a neighboring charge sensor. As shown in FIG. 6, jumps in the charge sensor current correspond to changes in the electron occupation in the dot. This can be used to distinguish between |L> or |R> occupation. Such measurement can also been done for a MOS double quantum dot.

In some instances of adiabatic quantum optimization, the final state is a product state in the Z eigenbasis. That is, each qubit is either a |1> or |0> in the final answer. In this case, the existing measurement is sufficient. In more general adiabatic quantum computing, this may not necessarily be true, and alternative approaches are necessary to read out qubits that, for example, are in the |+> or |−> state as the final answer state. Measurement of non-Z eigenbasis states can be accomplished through a non-adiabatic pulse and a single shot readout. For improved signal to noise in a charge qubit, multiple single shots can be performed, assuming that the qubit will relax back to the ground state sufficiently long after the non-adiabatic pulse has occurred.

As noted above, at least the semiconductor qubits 104 of the quantum computing apparatus 100 can be operated in a refrigerator. The adiabatic computation can rely on energy gap protection to preserve the ground state, wherein the energy gap corresponding to the semiconductor qubits is larger than that associated with conventional superconductor qubits. Environmental sources of energy greater than the gap that couple with the charge qubit may cause errors. Thus, the computation can be implemented and the qubits can be operated in a refrigerator, such as a dilution refrigerator, to reduce thermal energies below the gap energies near the charge qubit. Dilution refrigerators can achieve base temperatures of on the order of 0.01K, and other refrigeration systems can achieve even lower temperatures. The base temperature establishes roughly the temperature of the semiconductor crystal and the phonon population in the crystal. At such temperatures, the electrons may become weakly coupled to the phonon bath and electrons in quantum dots are effectively at 0K, assuming that the quantum dots are very weakly coupled to their electrical leads (e.g., through a large tunnel barrier) and have an excited state spectrum with a large energy gap between the ground and next excited state. Such conditions are met for few electron quantum dots (or single donors), which are charge-sensed and have either relative large tunnel coupling (>>8 ueV) or large detuning (also greater than approximately 8 ueV). Therefore, during an initialization stage, at least for a small number of the qubits 104, a sufficiently large tunnel coupling can be established, such that the qubits are in their ground state with very high fidelity, $p_{error} < \exp(-200\ \text{ueV}/10\ \text{ueV})$, despite noise from the environment.

Errors that may be of concern during evolution are those related to Landau-Zener transitions due to too rapid evolution through small gap regions and excitations from the ground state to any higher-excited state. The optimal evolution speed and path represents a challenge because it is dominated by the smallest gap region. Knowledge of the smallest gap is related to the knowledge of the solution to the problem represented by the Hamiltonian. A potential advantage of the semiconductor qubits is that the evolution path is made flexible through the ability to change the detuning (both negative and positive symmetrically), as well as independently tune the tunnel coupling. The independent tunability of such parameters differentiates the semiconductor qubits 104 from conventional qubits, and mitigates errors that may be caused by Landau-Zener transitions.

Errors caused by excitations may occur through interactions with phonons or more complex interactions with fluctuating charge defects. Plasmons and other excitations also cannot be ruled out as potential sources of excitations. Silicon may be particularly well-suited for forming the qubits 104, because silicon does not have as strong a piezoelectric component, and the interaction times can be slow (depending on the gap energy). That is, the probability of error can be small if the evolution through the smallest energy gap region is rapid compared to the phonon interaction time.

Figure 7A:
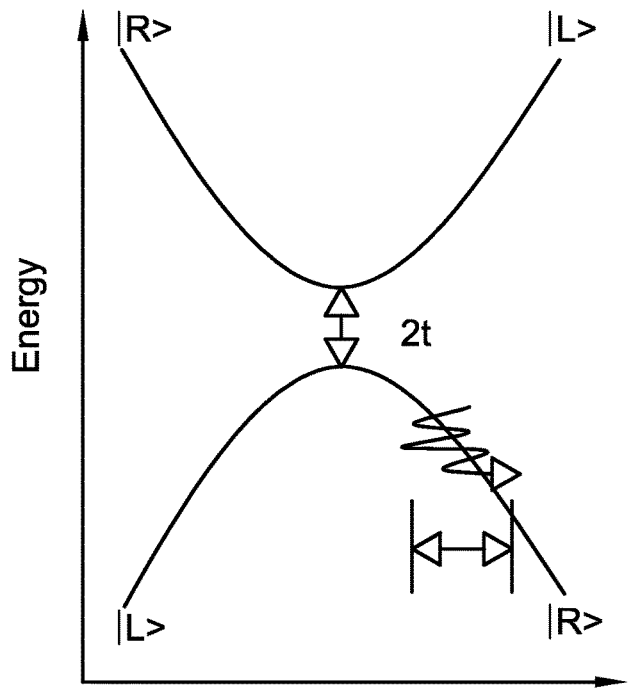
FIG. 7A depicts dephasing noise in a charge qubit.
Figure 7B:
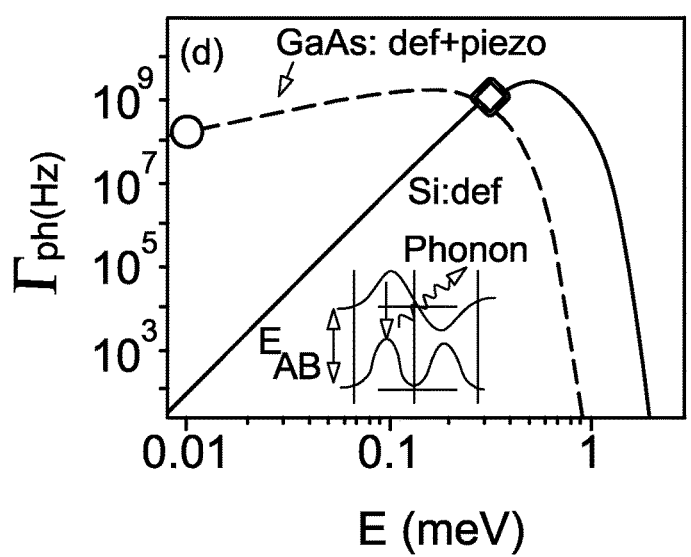
FIG. 7B depicts experimentally observed phonon relaxation times in Si and GaAs DQDs.

FIG. 7 includes graphs 802 and 804 that depict a theoretical calculation of phonon lifetimes as a function of energy. It can be noted that at least three qubit design methods can be pursued to suppress phonon interactions with the charge qubit. First, the material choice can significantly alter the interactions of the phonons with the charge qubits, as indicated in graph 802. Silicon, for example, has a more significant decay in interaction times than gallium arsenide and other piezoelectric materials. Second, the cutoff frequency of the phonon energy interaction with the charge qubit is related to the size of the double quantum dot. That is, wavelengths much shorter than the size of the charge qubit do not couple well with the charge qubit. The size of the qubit can be fabricated, therefore, to suppress higher energy phonon interactions and allow the charge qubits to probe smaller gap problems. Third, the phonon population may also be significantly suppressed by building the charge qubits on silicon that has been etched to make a phonon bandgap in wavelengths (energies) for which the charge qubit is potentially most sensitive.

Charge fluctuations from defects in the material also can couple to a charge qubit and alternately produce excitations. An exemplary nano-fabrication process flow has been developed for MOS charge qubits intended to minimize the effects in the system. Charge defects may further be avoided by building the charge qubits in enhance mode SiGe/sSi gate stacks. Further, STM-assisted fabrication can be employed to tune the size of the double quantum dot, electron number, and strength of coupling with atomic precision. STM-assisted fabrication has been shown to produce devices that have been measured with over an order of magnitude improvement in 1/f noise, which is often associated with charge traps/fluctuators.

Figure 8:
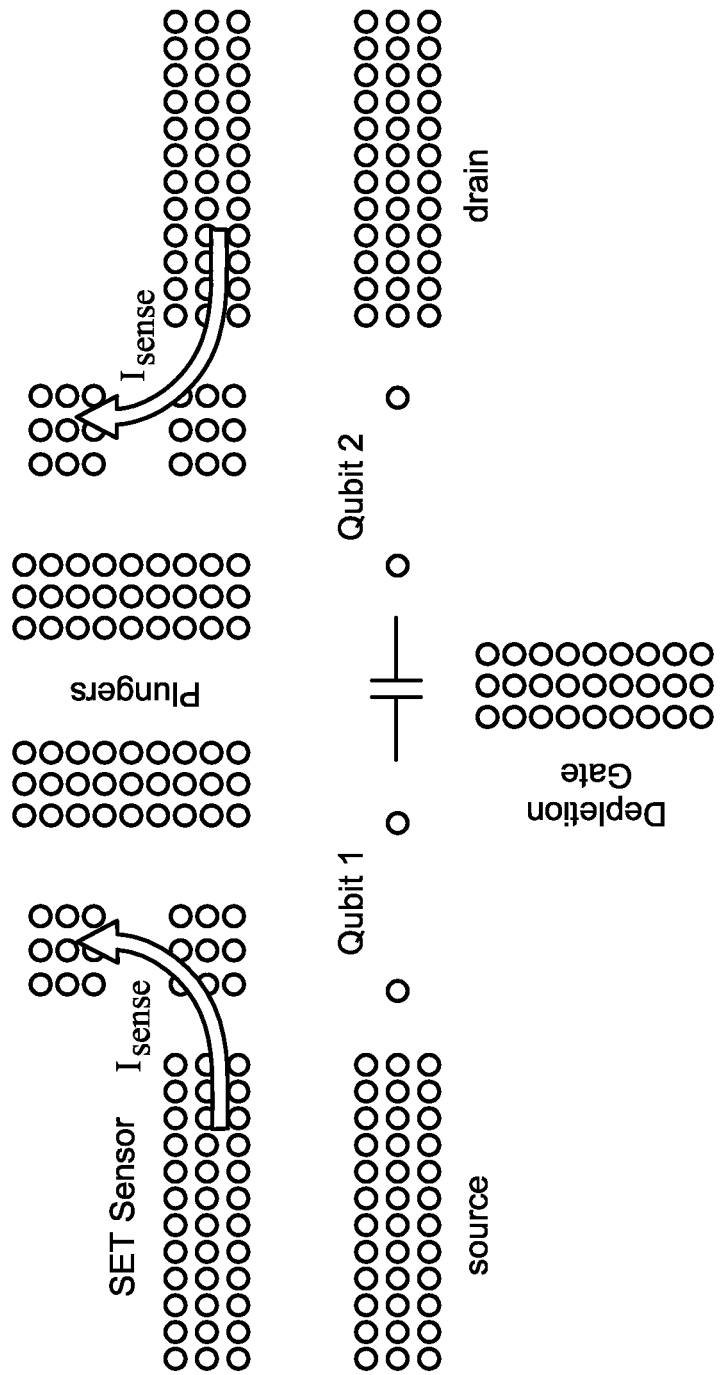
FIG. 8 depicts an exemplary layout for donor-based charge semiconductor qubits, where each position represents a donor location on an atomic lattice site.

FIG. 8 depicts an exemplary layout 800 for donor-based charge qubits. The fabrication technique used for these donor based qubit realizations is based on STM assisted fabrication. This technique of fabrication achieves atomic precision and can be used to lay-out charge qubits with relatively precise control over proximity of gates and quantum dots for relatively large ranges of energies. Additionally, STM-assisted fabrication can be used to produce relatively high uniformity, thus resulting in relatively high yield. Uniformity and yield are presently two significant challenges for the leading adiabatic qubit technology, superconducting flux qubits. Non-uniformity introduces shifts in the Hamiltonian values h and J that lead to the computer solving the incorrect problem, which becomes a challenging problem to debug or an extremely costly and time consuming process of characterizing and tuning every qubit. It can be noted that the charge qubit has a natural relaxation mechanism that can produce a self-correcting effect. That is, the extra energy in an excited state will entropically be driven into the surrounding environmental bath (for open system Free energy reasons). Therefore, if an excitation occurs due to either Landau-Zener or other processes, the charge qubits will have, in some cases, a non-negligible probability to release the energy and relax to the ground state, thus recovering the solution state. Phonon cavities, that may allow relatively long phonon lifetimes, can be used, such that many body-related phonon relaxation events may occur. In other words, for large systems, there is reason to believe that the lowest energy excited states are those that require several bits to flip, and such states may be frustrated from relaxation. Self-correcting paths, however, can be enhanced in phonon cavities. A combination of phonon bandgap engineering and phonon density of states enhancement can be employed to engineer relaxation mechanisms towards self-correction.

Figure 9:
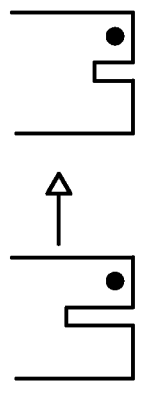
FIG. 9 illustrates exemplary ZZ, XZ and XX interactions that can be achieved utilizing an exemplary qubit, wherein the ZZ interaction is for quantum annealing, and the XZ and XX interactions represent a path towards universal adiabatic quantum computing.
Figure 9:
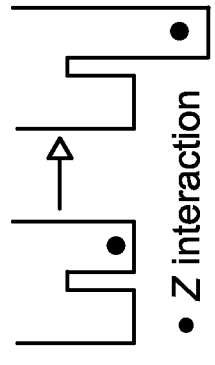
Figure 9:

Other procedures to suppress errors, such as encoding and dynamical decoding, are also possible paths towards extending the size of calculations attainable. Universal adiabatic quantum computing may require a broader hardware gate set for implementation. In particular, ZX and XX interaction are desirable. Accordingly, a ZX interaction can be obtained through capacitively coupling the electric dipole of one qubit to the tunnel barrier of another qubit. This can be constructed through STM-assisted fabrication, which allows devices to be engineered to the limit of precision. With reference to FIG. 9, exemplary interactions are depicted, including a ZZ interaction, a −ZZ interaction, an XX interaction, and an XZ interaction, wherein the interactions are a function of location of the tunnel coupling between DQDs.

An overall layout of DQD qubits that are coupled by a non-variable cross-bar capacitance has been proposed in connection with circuit model quantum computing. It is to be understood, however, that the adiabatic quantum annealing approach described herein is much easier to implement in terms of electrical signal when compared to circuit model quantum computing. As little as one signal line can be slowly modified in time, to modify the tunnel coupling, to perform the computation assuming high uniformity from, for example, STM assisted fabrication with hydrogen lithography. The time for calculation can be approximately $t \gg \Delta E \cdot h/(E_{gap})^2$ for a traversal of $\Delta E$ in energy phase space. This is one necessary condition to have a high probability that the evolution stays in the ground state. Gap sizes of a small multi-qubit system will be order of the coupling strength (e.g., ~100 ueV for non STM based structures), which implies that relatively rapid single qubit adiabatic evolutions are possible (e.g. much larger than 1 GHz). It can be noted that quantum algorithms are pursued because for certain calculations they are polynomial or exponentially more efficient than the best classical algorithms available. This implies that the speed of operation of single qubits does not need to be faster than classical transistor speeds in order to achieve extraordinary speed-ups.

Figure 10:
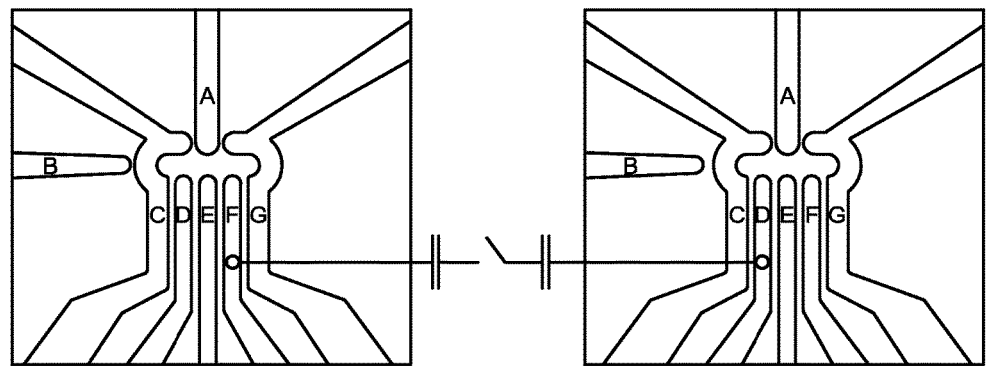
FIG. 10 illustrates exemplary electrodes corresponding to a pair of semiconductor qubits that are coupled through Coulombic repulsion (an alternate proposal is represented in FIG. 4).
Figure 11:
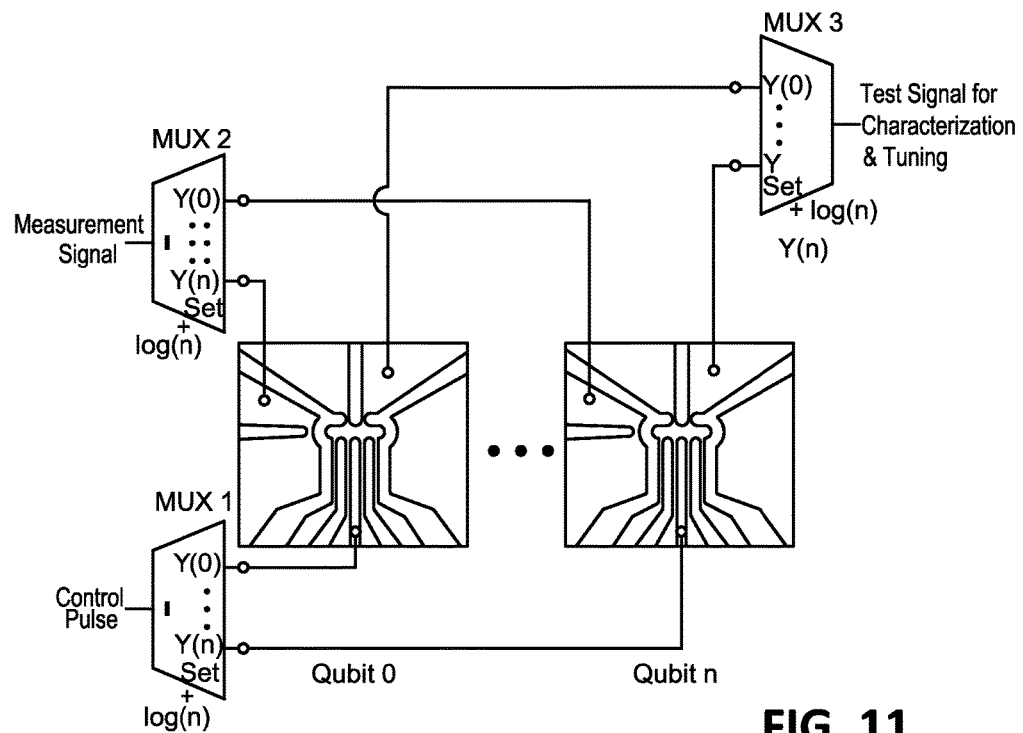
FIG. 11 depicts an exemplary technique for MUX and DEMUX wiring of a chip full of qubits in order to characterize, tune, and vary at least one parameter of semiconductor qubits during the quantum annealing computation.

FIG. 4 and FIG. 10 depict exemplary layouts 400 and 1000 of electrodes corresponding to a pair of qubits. FIG. 11 depicts an exemplary design for controlling voltages on gates including tunnel coupling corresponding to qubits in the plurality of semiconductor qubits 104 (as well as electronics for characterization and tuning and electronics for obtaining a measurement signal). Cryogenic CMOS can be included on the same quantum process chip for MUX and DEMUX. This is most readily achieved when implementing the qubit with the silicon material system. Voltages on electrodes that are not directly controlled during the computation (i.e., the tunnel barrier electrodes that control the gamma parameter in the Hamiltonian) might, for example, be sustained using capacitors that are refreshed between computations. The electrical input/output complexity is considerably less in the adiabatic quantum annealing approach compared to many other proposed quantum computing approaches. As described earlier, a single parameter in the Hamiltonian is slowly modified, and the magnitude and rate of change can be the same for every qubit. More flexibility can be beneficial, however, the minimum requirement for the hardware is a simple global parameter change. Electrically, this can represent only a single voltage changing in time and the change in time will be relatively slow. In an exemplary implementation, compensating voltages can be applied to more than one gate, wherein the compensating voltages can be tied to a single global voltage combined with programmed voltage dividers for each qubit (although other approaches are contemplated). Additionally, gap size may shrink as the problem size increases. Larger problem sizes, therefore, may require slower modulation of the $H_{initialization}$ parameter. From the perspective of the speed of the electoral implementation, this also means that it becomes less difficult to implement the evolution as the system grows. Many other quantum computing schemes require fast pulses, customized to each qubit (gigahertz), instead of a global voltage evolution for all qubits. The electronics challenges related to these other schemes are extreme and highlight a significant advantage in this quantum annealing approach.

Several rules may be in place for hardware with respect to a QUBO problem with quantum annealing. With respect to encoding, each qubit may have two eigenstates (binary answers) associated therewith, which are non-degenerate in nature. When a qubit is initialized for a particular optimization problem, the qubit can start in a superposition between the two eigenstates, wherein the superposition is the ground state of an initial Hamiltonian. Thus, reference is again made to Eq. (1). During the evolution process, $H_{init}$ initial can be slowly reduced and/or $H_{problem}$ can be slowly increased. Eventually, the system evolves to $H_{final}$, for which the ground state is the solution, and where $H_{final} = H_{problem} \gg H_{init}$. During readout, the state of each qubit is measured, wherein in some embodiments, the state must be measured prior to information being lost.

Figure 12:
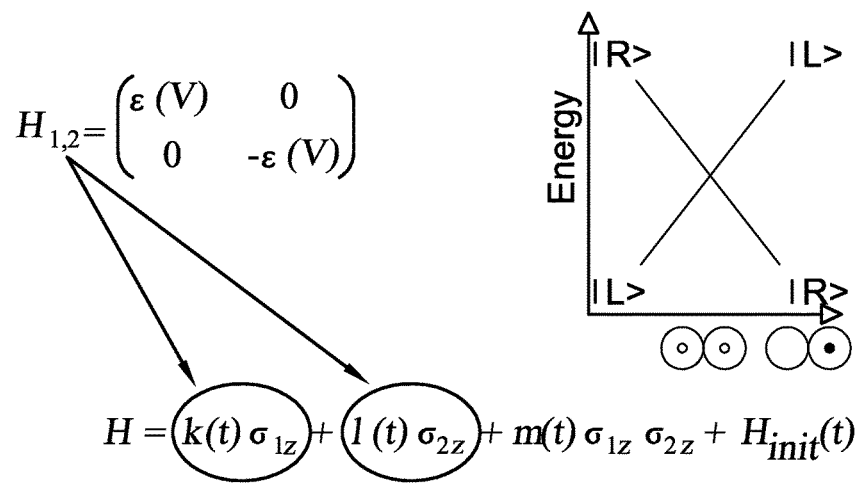
FIG. 12 illustrates exemplary Hamiltonian encoding of the charge qubit single-qubit terms for a quadratic unconstrained binary optimization (QUBO) problem, where Coulombic coupling is used to establish the m term in the Hamiltonian (FIG. 16).
Figure 13:
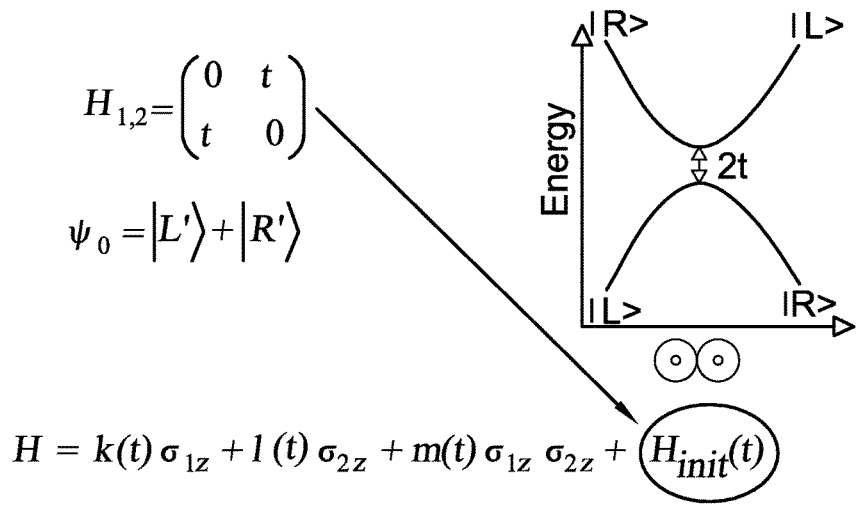
FIG. 13 illustrates exemplary Hamiltonian encoding of the charge qubit single-qubit terms for initialization of a quadratic unconstrained binary optimization (QUBO) problem.

Referring to FIG. 12 an exemplary charge qubit encoding for a QUBO problem is illustrated. Modulation of k and l, circled in FIG. 12, can be accomplished with voltages on gates (e.g., as output by the control voltage source 106). Turning to FIG. 13, initialization pertaining to the qubit is depicted.

Figure 14:
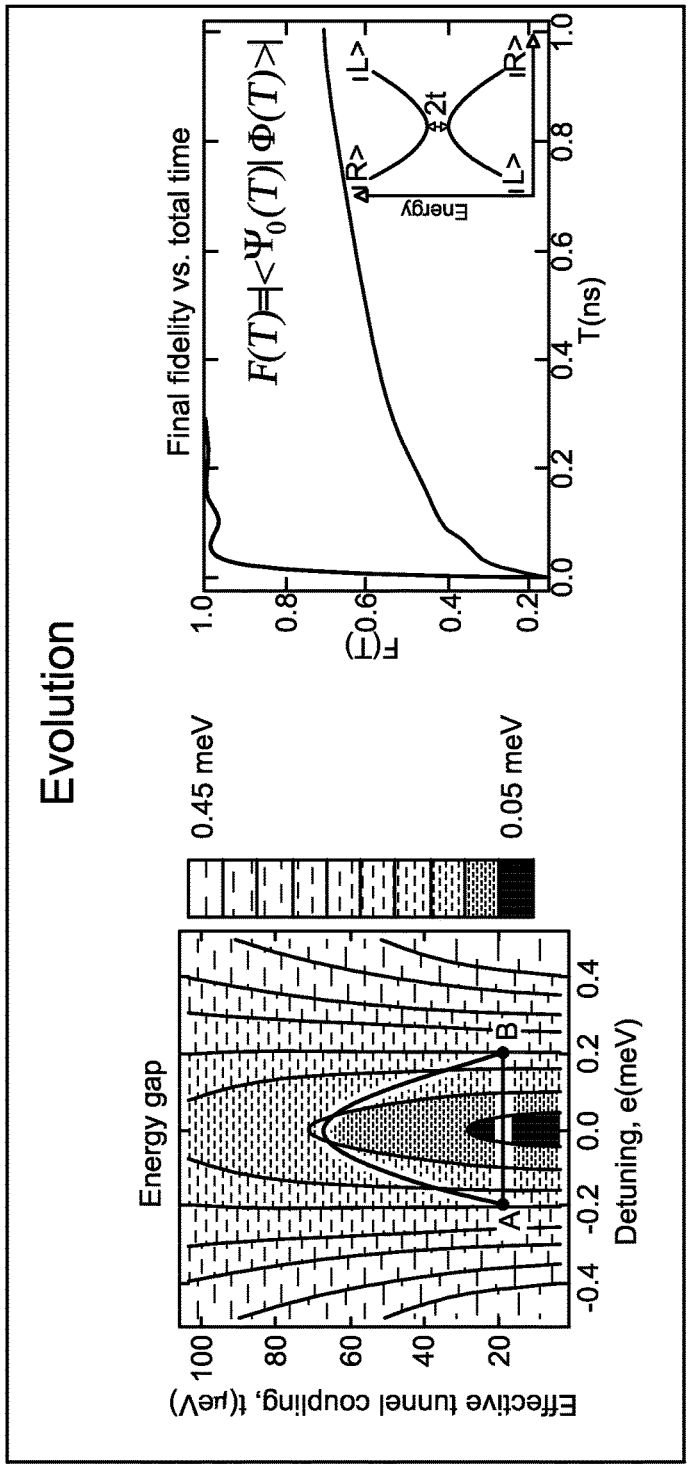
FIG. 14 illustrates an evolution process pertaining to a quantum computing apparatus, where two evolutions are illustrated showing the advantage of independent control over the h and gamma (e.g., t or tunnel coupling) terms in the Hamiltonian.

With respect to FIG. 14, data pertaining to evolution of a problem space is illustrated. Paths that trade-off reduction of tunneling gap with increased detuning are desirable over straight paths. The increased tunability of charge qubits (i.e., the increased orthogonality between the variables gamma, h and J in the Hamiltonian) relative to other adiabatic qubit choices is beneficial for making the optimized quantum annealing path available.

As references above, the semiconductor qubits 104 may also be singlet/triplet (m=−1) spin qubits. Specifically, spin degree of freedom for adiabatic quantum computing is an alternative to a charge qubit. Such approach has several advantages and disadvantages relative to the charge qubit. Advantages include 1) weaker coupling to environmental noise; 2) better temporal coherence for system that include a relatively small number of qubits (especially in the isotope enriched systems, such as 28 Si); 3) an existing experimentally-demonstrated path towards higher fidelity non-adiabatic operations that can be used for measurement outside of the Z eigenbasis; 4) sufficient temporal coherence to potentially more easily examined time-resolved tomography of the adiabatic state of each individual qubit; and 5) slower dissipative relaxation mechanisms. Disadvantages of such approach relative to charge qubits include: 1) the uncertain path towards achieving a large tunnel couple bandgap; 2) slower evolution times because of small bandgap; 3) challenging initialization state to produce; 4) a smaller range of the de-tuning or trade-off for faster energy relaxation mechanisms; and 5) increased difficulty of fabrication.

Figure 15:
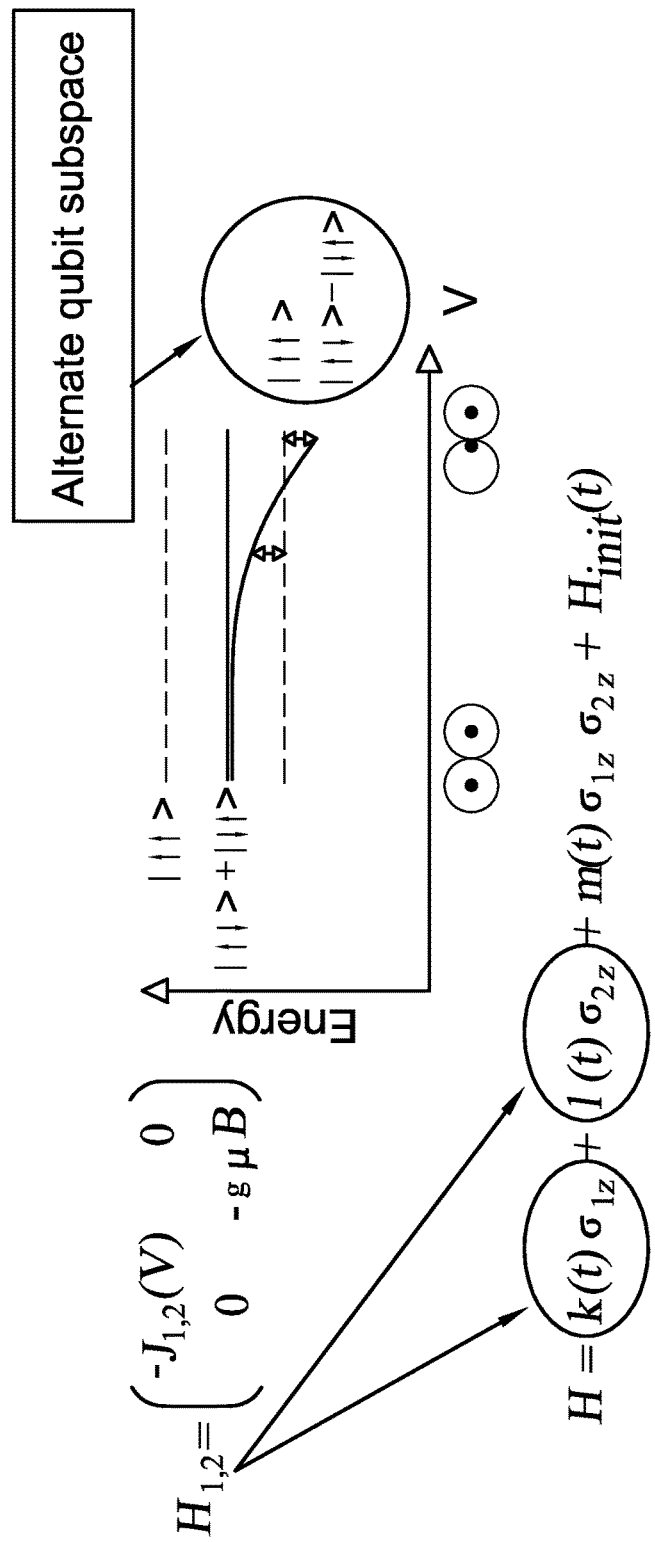
FIG. 15 includes a graph that depicts the singlet/triplet (m=−1) qubit encoding for a quadratic unconstrained binary optimization (QUBO) problem.

FIGS. 15 to 20 describe the S/T(m=−1) qubit Hamiltonian encoding for adiabatic quantum computing in accordance with the aspects described herein. Referring to FIG. 15, the alternate qubit subspace is depicted. The encoding shown in the algorithm of FIG. 15 uses the ground state instead of a metastable subspace, such that the k and l range is more flexible.

Figure 16:
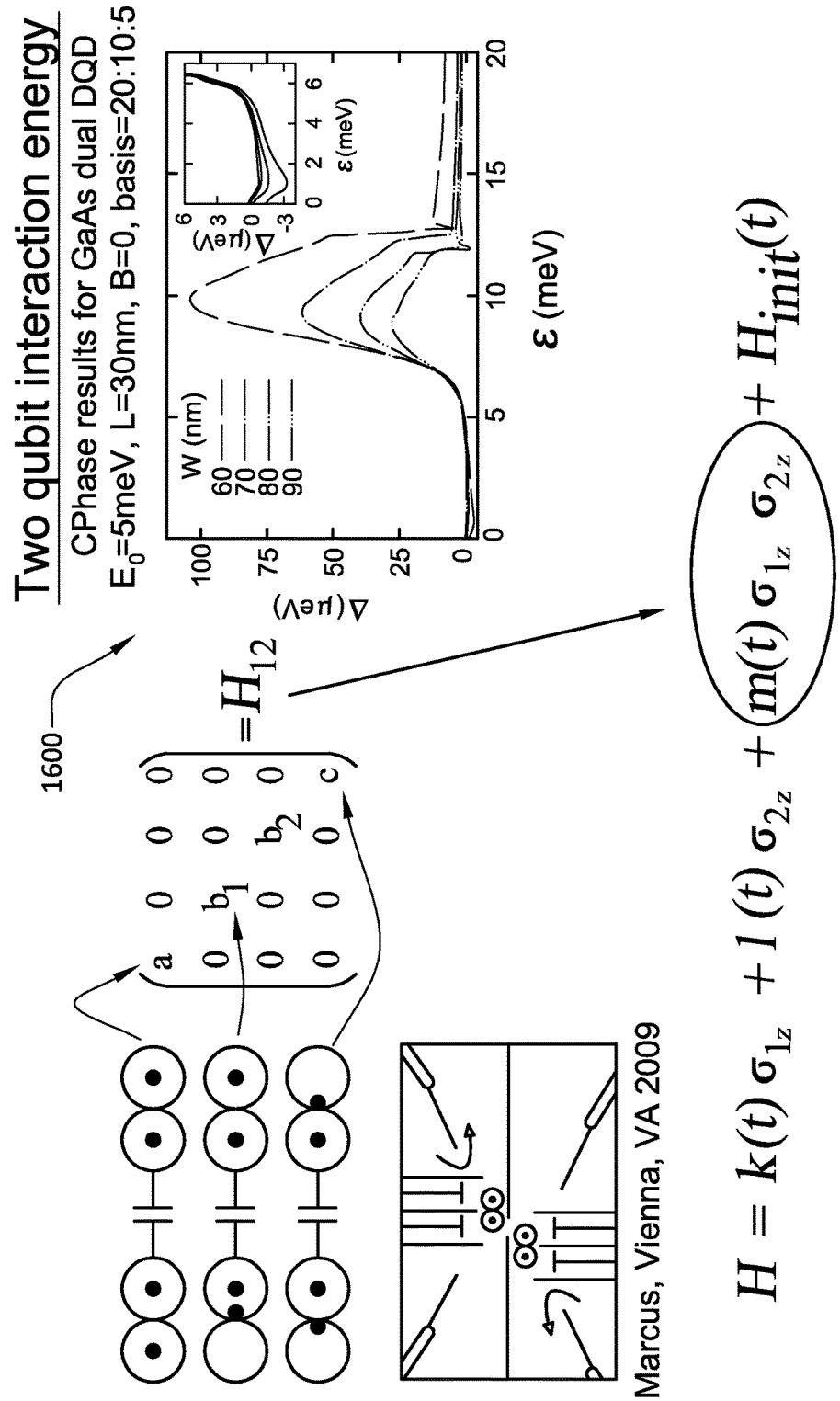
FIG. 16 illustrates the Hamiltonian for nearest neighbor semiconductor qubit interaction (i.e., Coulombic coupling) for a quadratic unconstrained binary optimization problem, wherein this coupling is the same for the charge qubit, S/T(m=−1) and the S/T(m=0) qubit encodings for QUBO.

FIG. 16 depicts nearest neighbor qubit interaction with such a qubit. In the exemplary algorithm shown in FIG. 16, m is positive and can be modulated using voltage on a barrier gate. Interaction magnitude is anecdotally observed to be approximately 0.1 J and coefficients can be tuned to produce Z1 and Z2. FIG. 16 further includes a graph 1700 that illustrates energy associated with two qubits interacting.

Figure 17:
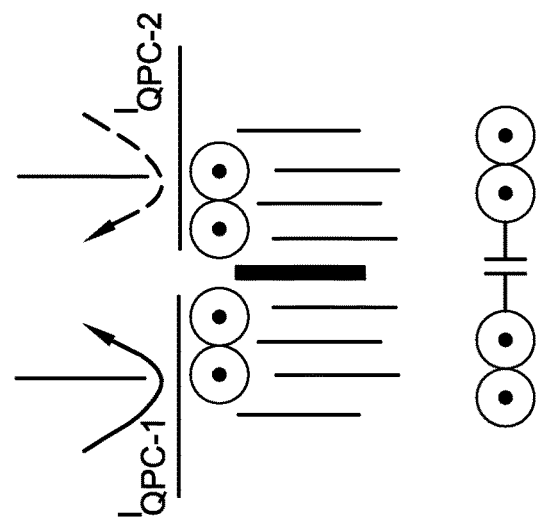
FIG. 17 illustrates readout and layout for coupling without a bar for an exemplary qubit in a linear array lay-out.
Figure 17:
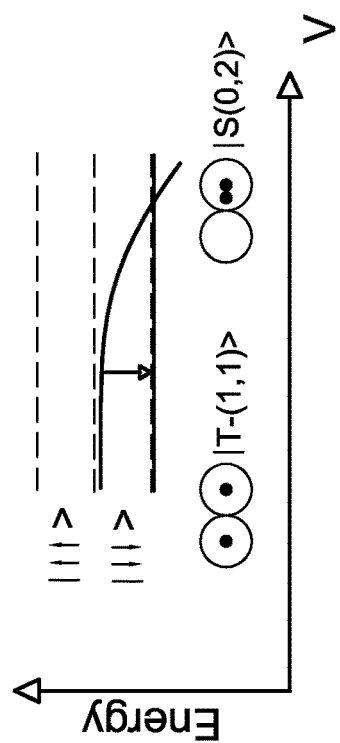
Figure 18:
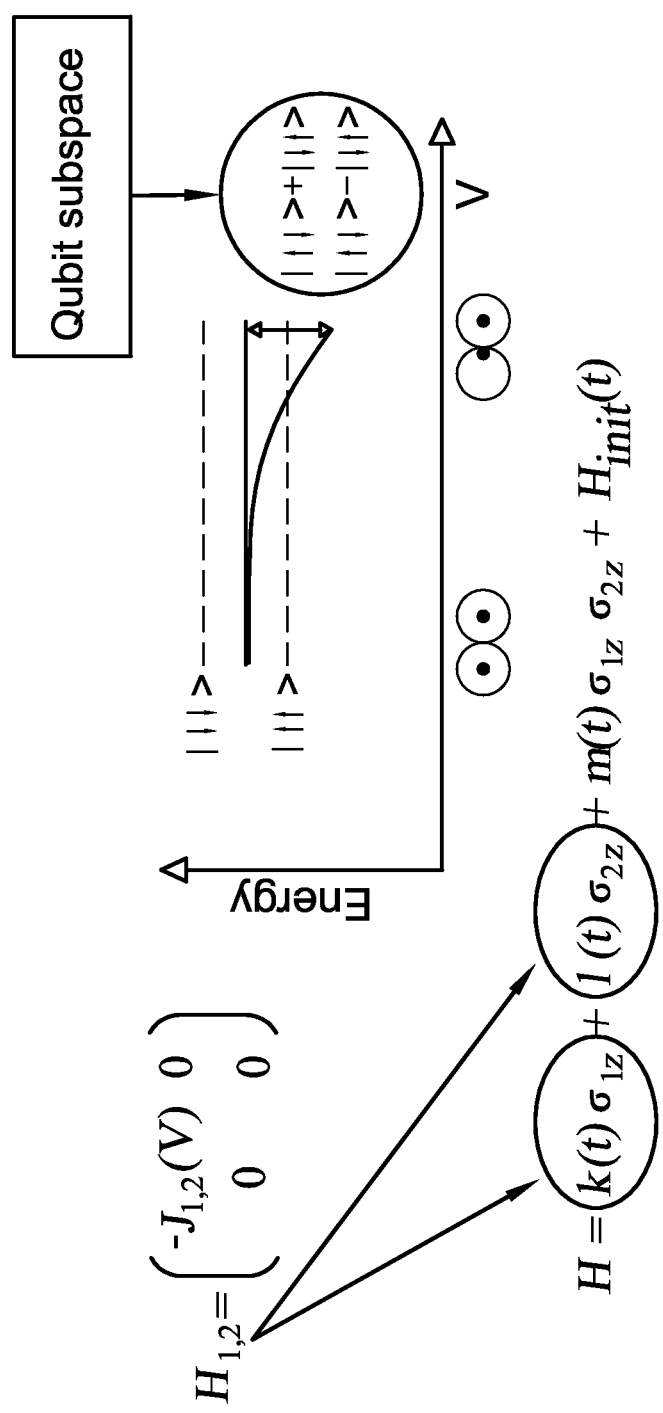
FIG. 18 illustrates S/T(m=0) single qubit encoding for QUBO.

FIG. 17 illustrates readout and layout for coupling without a bar, and FIG. 18 depicts S/T0 qubit encoding. As shown in FIG. 18, modulation of k and l can be accomplished with J(V), where −J can be produced with certain parameters of $B_z$, V and dot size. Furthermore, J can range from ueV to meV (or more).

Figure 19:
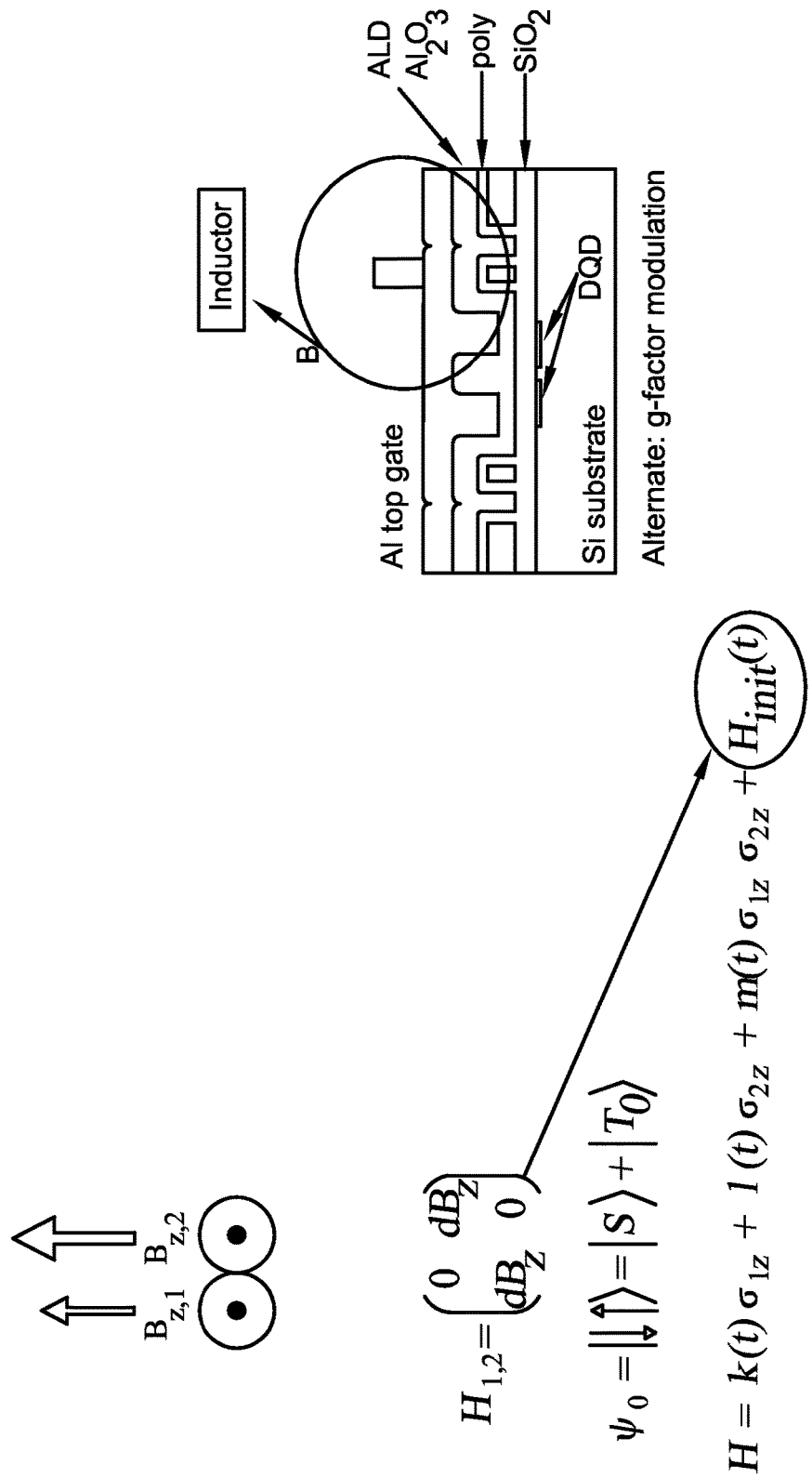
FIG. 19 depicts the initialization Hamiltonian for QUBO and one approach, schematically (right image) to generating the necessary gradient field (i.e., local inductor) of an exemplary qubit.
Figure 20:
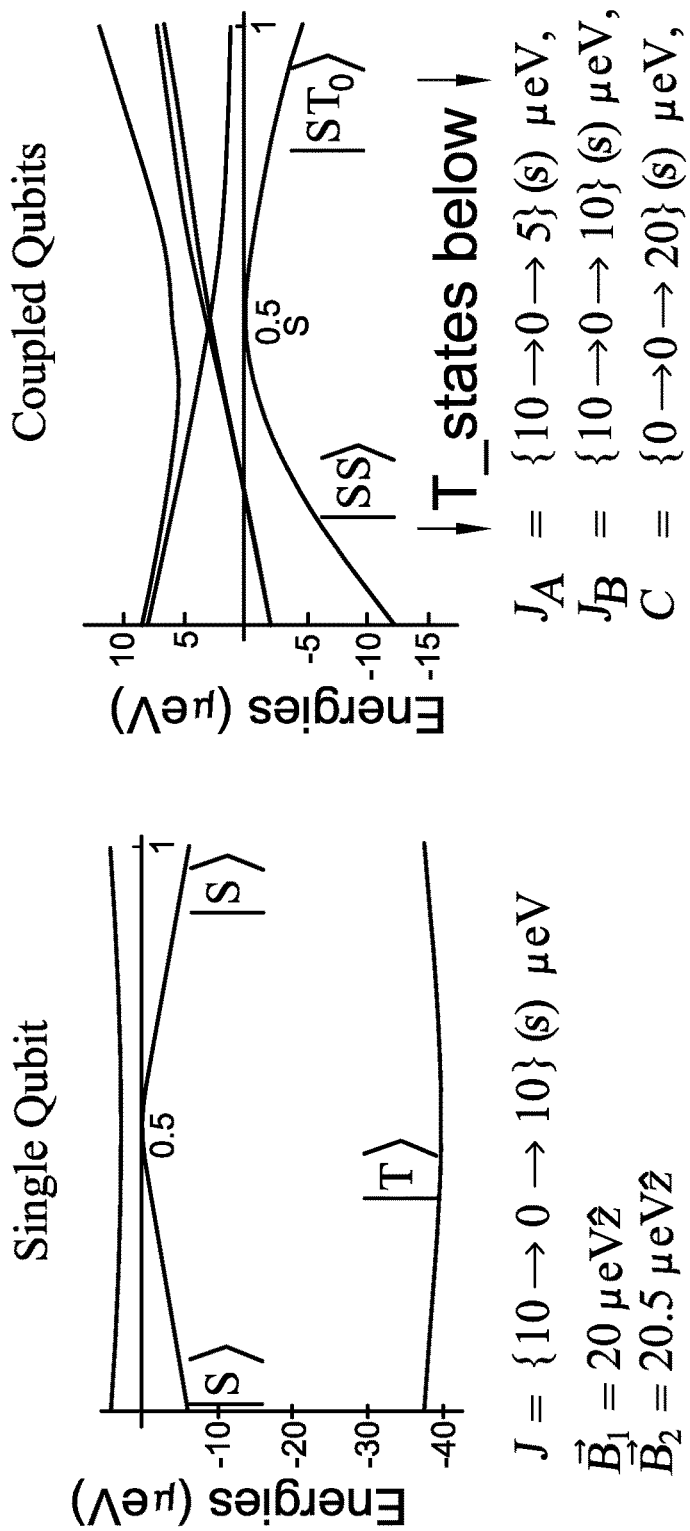
FIG. 20 illustrates evolution from a single qubit to a coupled qubit.

FIG. 19 depicts parameters pertaining to initialization of the singlet/triplet (m=0) qubit. The magnitude of the gradient may determine the minimum gap. This qubit has received considerable attention in the non-adiabatic quantum computing community and is a possible candidate for quantum annealing; however, this encoding will be limited in utility for large (i.e., long time scale) computations because the triplet state is in principle metastable. Relaxation of this state to a lower energy state (e.g., the m=−1 triplet) represents qubit leakage The S/T(m=0) qubit has short term advantages, which can lead to intermediate sized computers that are more competitive to classical approaches.

Figure 21:
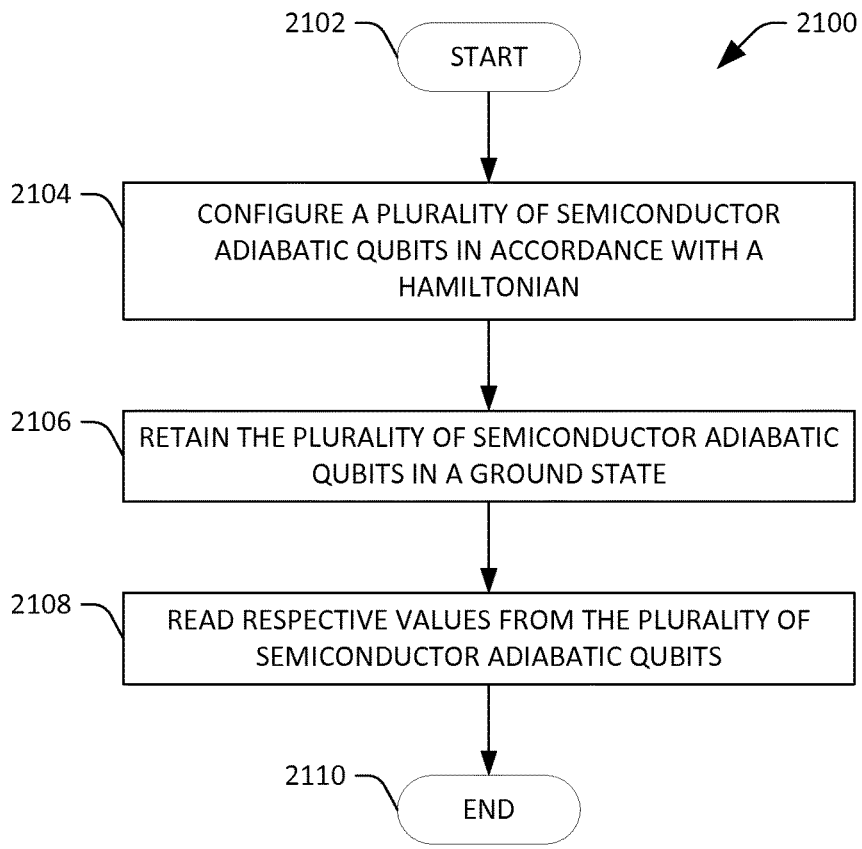
FIG. 21 is a flow diagram illustrating an exemplary methodology for obtaining a solution to an optimization problem provided to a quantum computing apparatus.

FIGS. 21 and 22 illustrate exemplary methodologies relating to quantum computing. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

With reference to FIG. 21, an exemplary methodology 2100 is illustrated. The methodology 2100 starts at 2102, and at 2104, a plurality of semiconductor adiabatic qubits are configured in accordance with a Hamiltonian. The Hamiltonian can represent an optimization problem that is desirably solved by way of a quantum computing apparatus. At 2106, the plurality of semiconductor adiabatic qubits are retained in a ground state including cases for which noise produced an excitation (i.e., error) but was self-corrected through relaxation mechanisms inherent to the charge qubit. That is, as noted above, the qubits can be initialized in the ground state, such that there is tunnel coupling and values of the qubits are superpositions of |0> and |1>. Subsequently, the tunnel coupling barrier can be raised slowly (e.g., thus inhibiting tunnel coupling), thereby causing the qubits to have states that are collectively indicative of a solution to the optimization problem. At 2108, respective values in the plurality of semiconductor adiabatic qubits are read, wherein such values are indicative of the solution to the optimization problem. The methodology 2100 completes at 2110.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A quantum computing apparatus comprising:
   a plurality of semiconductor adiabatic qubits, the plurality of semiconductor adiabatic qubits configured to have states respectively associated therewith that are collectively indicative of a solution to an optimization problem that is represented by a Hamiltonian, the Hamiltonian comprises a first parameter and a second parameter, a semiconductor qubit in the plurality of semiconductor qubits comprises:
      a first electrode;
      a second electrode, wherein a relative voltage between the first electrode and the second electrode is varied in time to control a magnitude of the first parameter of the Hamiltonian, wherein the first parameter is an amount of tunnel coupling between the semiconductor qubit and a neighboring semiconductor qubit in the plurality of semiconductor qubits;
      a third electrode; and
      a fourth electrode, wherein voltages on the third electrode and the fourth electrode, respectively, control a magnitude of the second parameter;
   circuitry that is configured to read out values from the semiconductor qubits that are indicative of the respective states.

2. The quantum computing apparatus of claim 1, the plurality of semiconductor adiabatic qubits being charge qubits.

3. The quantum computing apparatus of claim 2, the charge qubits being double quantum dot qubits.

4. The quantum computing apparatus of claim 2, further comprising a voltage source that is configured to output a voltage signal, the voltage signal causing tunnel coupling within a charge qubit in the plurality of charge qubits to change over time.

5. The quantum computing apparatus of claim 1, the semiconductor adiabatic qubits formed in one of silicon, SiGe, or SiGeC.

6. The quantum computing apparatus of claim 1, the semiconductor adiabatic qubits formed in gallium arsenide or InAs.

7. The quantum computing apparatus of claim 1, further comprising a voltage source that is configured to output a voltage signal, the voltage signal provided to an electrode that causes at least one qubit in the plurality of semiconductor adiabatic qubits to be biased to have an eigenbasis of $|0\rangle$ or $|1\rangle$.

8. The quantum computing apparatus of claim 1, further comprising a voltage source that is configured to output a voltage signal, the voltage signal provided to an electrode that causes conductivity of a metallic coupler between qubits to alter to a fixed setting for a selected computation, the conductivity variable for other computations.

9. The quantum computing apparatus of claim 1, further comprising a voltage source that is configured to output at least one voltage signal that is configured to initialize the semiconductor adiabatic qubits, wherein at least one semiconductor adiabatic qubit in the plurality of semiconductor adiabatic qubits is caused to have a value corresponding thereto of a superposition of $|0\rangle$ and $|1\rangle$.

10. The quantum computing apparatus of claim 1, wherein the plurality of semiconductor adiabatic qubits are formed in the semiconductor material by way of scanning tunneling microscope techniques.

11. A method comprising:
configuring a plurality of semiconductor adiabatic qubits in accordance with a Hamiltonian that is representative of an optimization problem, the Hamiltonian has a first parameter and a second parameter, the semiconductor adiabatic qubits comprised by a quantum computing device;
using a first voltage signal, tuning a value of the first parameter of the Hamiltonian, the voltage signal changing the value of the first parameter over time, the parameter corresponding to tunnel coupling between neighboring qubits in the plurality of semiconductor qubits;
using a second voltage signal, tuning a value of the second parameter of the Hamiltonian; and
reading respective values from the plurality of semiconductor adiabatic qubits responsive to neighboring qubits being decoupled, the respective values collectively being indicative of a solution to the optimization problem.

12. The method of claim 11, the semiconductor adiabatic qubits being double quantum dot qubits.

13. The method of claim 11, the semiconductor adiabatic qubits formed in silicon.

14. The method of claim 11, the semiconductor adiabatic qubits formed in gallium arsenide.

15. The method of claim 11, the semiconductor adiabatic qubits being charge qubits.

16. The method of claim 11, wherein configuring the plurality of semiconductor adiabatic qubits comprises initializing the plurality of semiconductor adiabatic qubits to have values of a superposition of $|0\rangle$ and $|1\rangle$.

17. The method of claim 16, the semiconductor adiabatic qubits being double quantum dot qubits, wherein retaining the plurality of semiconductor adiabatic qubits in the ground state comprises, over time, decreasing the tunnel coupling within each double quantum dot qubit.

18. A quantum computing apparatus, comprising:
a plurality of semiconductor adiabatic qubits formed in a semiconductor material, the qubits being charge qubits;
at least one voltage source that is configured to:
output a first voltage signal to tune a value of a first parameter of a Hamiltonian that represents an optimization problem that is to be solved by the quantum computing apparatus, the first voltage signal changing the value over time, the first parameter corresponds to coupling between neighboring qubits in the plurality of semiconductor qubits; and
output a second voltage signal to tune a second parameter of the Hamiltonian; and
readout electronics that read out values from the plurality of semiconductor qubits responsive to neighboring qubits being decoupled, wherein the values read out by the readout electronics are indicative of a solution to the optimization problem represented by the Hamiltonian.

19. The quantum computing apparatus of claim 18, the semiconductor material being silicon.

20. The quantum computing apparatus of claim 18, wherein the second parameter corresponds to biasing at least one qubit to have a value of $|0\rangle$ or $|1\rangle$.

* * * * *